(12) United States Patent
Yuan

(10) Patent No.: US 9,391,097 B2
(45) Date of Patent: Jul. 12, 2016

(54) THIN FILM TRANSISTOR, ARRAY SUBSTRATE AND METHOD OF MANUFACTURING THE SAME AND DISPLAY DEVICE

(71) Applicant: BOE TECHNOLOGY GROUP CO., LTD., Beijing (CN)

(72) Inventor: Guangcai Yuan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 86 days.

(21) Appl. No.: 13/703,590

(22) PCT Filed: Oct. 11, 2012

(86) PCT No.: PCT/CN2012/082800
§ 371 (c)(1),
(2) Date: Dec. 11, 2012

(87) PCT Pub. No.: WO2013/097519
PCT Pub. Date: Jul. 4, 2013

(65) Prior Publication Data
US 2014/0077203 A1    Mar. 20, 2014

(30) Foreign Application Priority Data
Dec. 31, 2011 (CN) .......................... 2011 1 0460362

(51) Int. Cl.
*H01L 29/786* (2006.01)
*H01L 21/04* (2006.01)
(Continued)

(52) U.S. Cl.
CPC .......... *H01L 27/124* (2013.01); *H01L 27/1225* (2013.01); *H01L 27/1259* (2013.01); *H01L 29/66969* (2013.01); *H01L 29/7869* (2013.01); *H01L 29/78606* (2013.01)

(58) Field of Classification Search
USPC ............... 257/72, 291, 40, 57, 59, 66, 69, 79
See application file for complete search history.

(56) References Cited

U.S. PATENT DOCUMENTS 5,790,222 A * 8/1998 Kim .............................. 349/139
6,166,400 A   12/2000 Chang et al.
(Continued)

FOREIGN PATENT DOCUMENTS

| CN | 1619392 A | 5/2005 |
| CN | 1693972 A | 11/2005 |

(Continued)

OTHER PUBLICATIONS

First Chinese Office Action dated Feb. 26, 2013; Appln. No. 201110460362.5.

(Continued)

*Primary Examiner* — Mary Wilczewski
*Assistant Examiner* — Tsz Chiu
(74) *Attorney, Agent, or Firm* — Ladas & Parry LLP

(57) ABSTRACT

According to embodiments of the present invention, there are provided a thin film transistor, an array substrate and method of manufacturing the same, and a display device. The thin film transistor comprises: a gate electrode, a gate insulating layer, a semiconductor active layer, an etch stop layer, a source electrode and a drain electrode, wherein the gate insulating layer is interposed between the gate electrode and the semiconductor active layer, the etch stop layer covers the semiconductor active layer, and has a first via hole and a second via hole formed therein which expose a part of the semiconductor active layer, the source electrode of the thin film transistor contacts with the semiconductor active layer through the first via hole, and the drain electrode of the thin film transistor contacts with the semiconductor active layer through the second via hole.

6 Claims, 7 Drawing Sheets

(51) Int. Cl.
*H01L 21/34* (2006.01)
*H01L 29/02* (2006.01)
*H01L 27/12* (2006.01)
*H01L 29/66* (2006.01)

(56) References Cited

U.S. PATENT DOCUMENTS

| | | | | |
|---|---|---|---|---|
| 8,193,535 | B2* | 6/2012 | Ha et al. | 257/72 |
| 8,436,353 | B2* | 5/2013 | Moriguchi | H01L 29/78609 257/57 |
| 8,575,605 | B2* | 11/2013 | Heo | H01L 27/1225 257/40 |
| 8,921,850 | B2* | 12/2014 | Yu | H01L 29/66969 257/347 |
| 2001/0046005 | A1* | 11/2001 | Lim et al. | 349/44 |
| 2005/0099551 | A1 | 5/2005 | Yang et al. | |
| 2005/0242352 | A1 | 11/2005 | Jeoung et al. | |
| 2007/0040951 | A1 | 2/2007 | Lee et al. | |
| 2010/0032664 | A1 | 2/2010 | Lee et al. | |
| 2010/0165227 | A1 | 7/2010 | Liu et al. | |
| 2010/0176388 | A1* | 7/2010 | Ha et al. | 257/40 |
| 2010/0243993 | A1* | 9/2010 | Saito et al. | 257/40 |
| 2010/0301328 | A1* | 12/2010 | Yamazaki | H01L 29/4908 257/43 |
| 2011/0163329 | A1* | 7/2011 | Kim et al. | 257/88 |
| 2011/0169010 | A1* | 7/2011 | Park et al. | 257/72 |
| 2011/0215328 | A1* | 9/2011 | Morosawa et al. | 257/59 |
| 2012/0007158 | A1* | 1/2012 | Yoon et al. | 257/295 |
| 2012/0220077 | A1 | 8/2012 | Ha et al. | |

FOREIGN PATENT DOCUMENTS

| | | |
|---|---|---|
| CN | 101154677 A | 4/2008 |
| CN | 101770124 A | 7/2010 |
| CN | 102194887 A | 9/2011 |
| CN | 102651401 A | 8/2012 |
| JP | 2010-041058 A | 2/2010 |
| JP | 2010-157740 A | 7/2010 |
| JP | 2010-278077 A | 12/2010 |
| KR | 20090105560 A | 10/2009 |
| KR | 20100005900 A | 1/2010 |
| KR | 20110100580 A | 9/2011 |
| WO | 2009/034953 A1 | 3/2009 |

OTHER PUBLICATIONS

Second Chinese Office Action dated May 13, 2013; Appln. No. 201110460362.5.
Chinese Patent Office Rejection Decision dated Jul. 19, 2013; Appln. No. 201110460362.5.
Korean Patent Office Action dated Nov. 18, 2013; Appln. No. 10-2012-7032409.
International Search Report mailed Jan. 17, 2013; PCT/CN2012/082800.
Korean Notice of Allowance dated May 16, 2014; Appln. No. 10-2012-7032409.
International Preliminary Report on Patentability dated Jul. 1, 2014; PCT/CN2012/082800.
Chinese Patent Office Reexamination Decision dated Oct. 24, 2014; Appln. No. 201110460362.5.
First Chinese Office Action dated May 20, 2015; Appln. No. 201310485546.6.
Extended European Search Report dated Jan. 7, 2015; Appln. No. 12791675.7-1504/2800140 PCT/CN2012082800.
Second Chinese Office Action dated Dec. 7, 2015; Appln. No. 201310485546.6.
Third Chinese Office Action dated May 5, 2016; Appln. No. 201310485546.6.

* cited by examiner

US 9,391,097 B2

THIN FILM TRANSISTOR, ARRAY SUBSTRATE AND METHOD OF MANUFACTURING THE SAME AND DISPLAY DEVICE

CROSS REFERENCE TO RELATED APPLICATIONS

This application is a national stage application under 35 U.S.C. 371 and claims the benefit of PCT Application No. PCT/CN2012/082800 having an international filing date of Oct. 11, 2012, which designated the United States, which PCT application claimed the benefit of Chinese Application No. 201110460362.5 filed Dec. 31, 2011, the disclosure of each of which are incorporated herein by reference.

FIELD OF THE INVENTION

Embodiments of the present invention relate to a thin film transistor, an array substrate and method of manufacturing the same, and a display device.

BACKGROUND

The initial research on the Oxide Thin Film Transistor (OTFT) technology mainly aims to reduce power consumption of active display devices, and make display devices be thinner and lighter and have a faster response speed. The technology starts to step toward a probationary stage in the early 21st century. As a new generation of Organic Light-Emitting Diodes (OLEDs), which has characteristics of being ultrathin, light weight, low power consumption and emitting light per se and can provide a more beautiful color and a clearer image, steps on a practical stage formally. The Oxide Thin Film Transistor technology has been considered to be able to take the place of an existing Low Temperature Poly Silicon (LTPS) technology, especially for application in the field of a large-scale display.

An oxide thin film transistor and a method of manufacturing an array substrate in prior art will be described below with reference to FIG. 1.

FIG. 1 is a cross-sectional view illustrating an existing OTFT array substrate. The existing oxide thin film transistor and the method of manufacturing the array substrate will now being described with reference to FIG. 1.

S101, forming a gate metal layer on a transparent substrate.

During manufacture of TFTs, a gate metal layer is usually fabricated by means of magnetron sputtering. The electrode material can be selected according to different device structures and process requirements, and metals commonly used for gate electrodes are Mo, Mo—Al—Mo alloy, Mo/Al—Nd/Mo stack material, Cu and metal titanium and an alloy thereof, etc.

S102, performing a patterning process on the gate metal layer, so as to form a gate electrode and a gate line.

By means of wet etching, the gate metal layer is subjected to a patterning process.

S103, forming a gate insulating layer on the gate metal layer.

After patterning of the gate metal layer 11, it is cleaned by a Pre-clean process (cleaning prior to film formation). Then, by means of Plasma Enhanced Chemical Vapor Deposition (PECVD), a gate insulating layer 12 is fabricated on the substrate with the gate metal layer. The material for manufacturing the gate insulating layer is widely used, such as, a silicon dioxide ($SiO_2$) thin film, a silicon nitride (SiNx) thin film, a silicon oxynitride (SiOxNy) thin film, an aluminum oxide ($Al_2O_3$) thin film, a TiOx thin film and a composite multilayered film of the above thin films.

S104, performing a surface treatment on the gate insulating layer.

During manufacture of a thin film transistor, characteristics of a surface of the gate insulating layer 12 play a very important role in characteristics of the entire TFT, especially for an oxide thin film transistor. A common treating method is that, a plasma is used for treatment or a surface modification is conducted.

S105, forming an oxide semiconductor thin film.

A most key link in manufacture of OTFTs is production of an active layer oxide semiconductor. Main manufacturing methods are magnetron sputtering deposition, solution method, etc. Oxide semiconductors now being widely used are Indium Gallium Zinc Oxide (IGZO), Indium Gallium Tin Oxide (IGTO), Indium Zinc Oxide (IZO) and so on, and composites concerning them which are formed at different ratios.

S106, performing a patterning process on the oxide semiconductor thin film.

The patterning process may be wet etching or dry etching, but use of different methods will do different harms to the oxide semiconductor layer. Therefore, selection of a suitable patterning process is an important way to improve characteristics of OTFTs. After the oxide semiconductor thin film is subjected to the patterning process, an oxide semiconductor active layer 13 is formed.

S107, forming an etch stop thin film and performing a patterning process.

An etch stop thin film is usually patterned by means of dry etching, so as to form an Etch Stop Layer (ESL) 14. Generally, it is necessary that an inorganic insulating material such as SiOx, SiNx, SiOxNy, $Al_2O_3$, TiOx or the like be adopted as material for the etch stop layer, and its purpose is to decrease the harm to the oxide semiconductor thin film during patterning of a data-line metal layer.

S108, forming a data-line metal layer.

Firstly, a layer of data-line metal thin film is deposited, and then it is patterned by means of wet etching, so as to form a data line, a data line lead wire, a source electrode (e.g. 15a in FIG. 1) and a drain electrode (e.g. 15b in FIG. 1).

S109, forming a passivation layer and etching a via hole.

After patterning of the source electrode and the drain electrode, a passivation layer 16 is formed on the entire surface. Generally, the passivation layer adopts an inorganic insulating material such as SiOx, SiNx, SiOxNy, $Al_2O_3$, TiOx or the like. Etching of a via hole is conducted after formation of the passivation layer, and the formed via hole is denoted by 17 in FIG. 1 and is used to make a pixel electrode which is formed later contact with the drain electrode.

S110, depositing and patterning a pixel electrode layer.

After formation of the via hole, a pixel electrode layer 18, material now being widely used for which is indium tin oxide, is formed, and subjected to a patterning process by means of wet etching.

As can be seen from the above manufacturing method, among existing manufacturing methods of an OTFT array substrate, the most widely adopted one is the foregoing that a six-patterning process is used to form the gate metal layer, the semiconductor layer, the etch stop layer, the data-line metal layer, the passivation-layer via hole and the pixel electrode layer. However, film formation, exposure, etching and other complex procedures after the semiconductor active layer will directly affect properties of the oxide semiconductor thin film; and meanwhile, as the etch stop layer does not fully cover the oxide semiconductor active layer, the etch stop layer cannot protect the oxide semiconductor active layer favorably in processes concerning the oxide semiconductor, and the oxide semiconductor active layer is broken in a process of illumination or etching, to thereby affect device properties of thin film transistors.

SUMMARY

According to an embodiment of the present invention, there is provided a thin film transistor, comprising: a gate electrode, a gate insulating layer, a semiconductor active layer, an etch stop layer, a source electrode and a drain electrode, wherein, the gate insulating layer is interposed between the gate electrode and the semiconductor active layer, the etch stop layer covers the semiconductor active layer and has a first via hole and a second via hole formed therein which expose a part of the semiconductor active layer, the source electrode of the thin film transistor contacts with the semiconductor active layer through the first via hole, and the drain electrode of the thin film transistor contacts with the semiconductor active layer through the second via hole.

According to another embodiment of the present invention, there is provided a thin film transistor array substrate, comprising: a substrate and a thin film transistor formed on the substrate, wherein the thin film transistor comprises a gate electrode, a gate insulating layer, a semiconductor active layer, an etch stop layer, a source electrode and a drain electrode, wherein, the gate insulating layer is interposed between the gate electrode and the semiconductor active layer, the etch stop layer covers the semiconductor active layer and has a first via hole and a second via hole formed therein which expose a part of the semiconductor active layer, the source electrode of the thin film transistor contacts with the semiconductor active layer through the first via hole, and the drain electrode of the thin film transistor contacts with the semiconductor active layer through the second via hole.

According to still another embodiment of the present invention, there is provided a method of manufacturing a thin film transistor array substrate, comprising: forming a gate metal layer, a gate insulating layer, a semiconductor active layer and an etch stop layer on a substrate in sequence, the gate metal layer comprising a gate electrode, a gate line and a gate line lead wire, and the etch stop layer at least covering an overall upper surface of the semiconductor active layer; forming a first via hole and a second via hole in the etch stop layer using a via-hole connection process so as to expose a part of the semiconductor active layer; and forming a data-line metal layer, a passivation layer and a pixel electrode layer in sequence, the data-line meta layer comprising a data line, a data line lead wire and a source electrode and a drain electrode of a thin film transistor, the source electrode contacting with the semiconductor active layer though the first via hole, and the drain electrode contacting with the semiconductor active layer through the second via hole.

According to yet still another embodiment of the present invention, there is provided a display device, comprising the above-mentioned thin film transistor array substrate.

BRIEF DESCRIPTION OF THE DRAWINGS

To illustrate technical solutions in embodiments of the present invention more clearly, accompanied drawings of the embodiments will be briefly introduced below. Obviously, the accompanied drawings described below merely relate to some embodiments of the present invention, and are not limitation on the present invention.

DETAILED DESCRIPTION

In order to make objects, technical details and advantages of the embodiments of the invention apparent, hereinafter, technical solutions in embodiments of the present invention will be clearly and fully described in combination with the accompanied drawings in the embodiments of the present invention. Apparently, the embodiments to be described are merely a part but not all of embodiments of the present invention. Every other embodiment as would be obvious to those ordinarily skilled in the art on the basis of described embodiments in the present invention without creative work, comes within the protection scope of the present invention.

Figure 1:
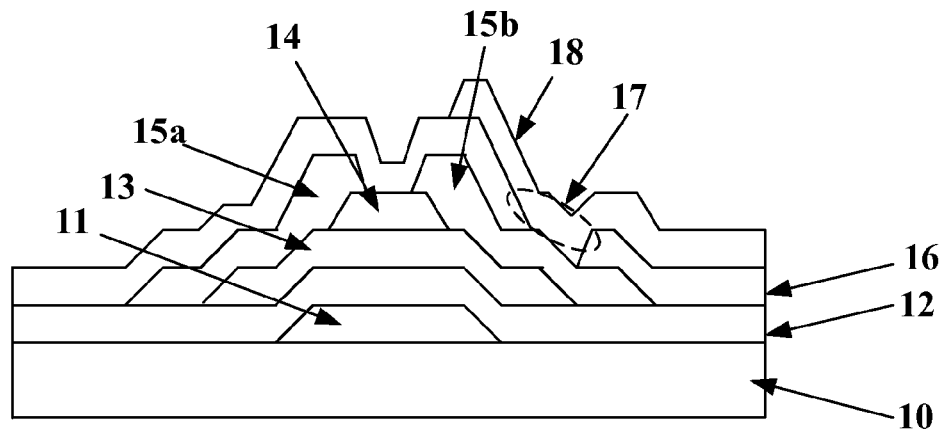
FIG. 1 is a structurally schematic view illustrating an OTFT array substrate in prior art.
Figure 2A:
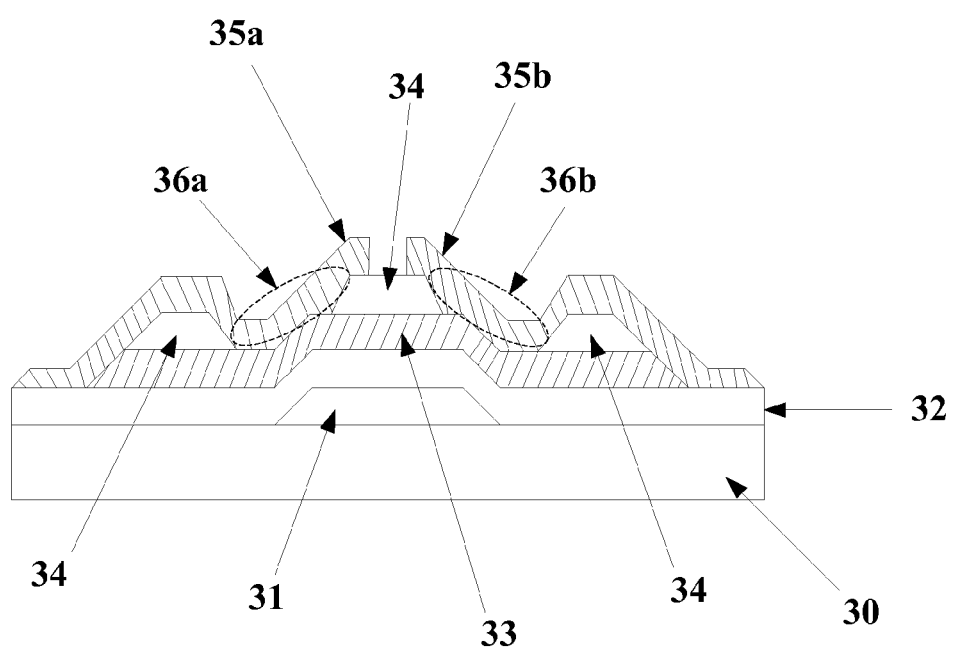
FIG. 2A is a structurally schematic view illustrating a thin film transistor provided by an embodiment of the present invention.
Figure 2B:
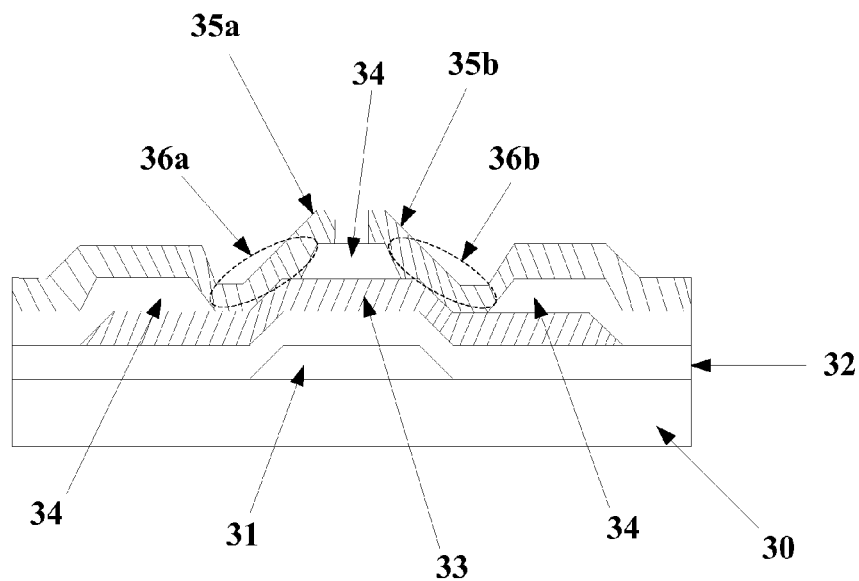
FIG. 2B is a structurally schematic view illustrating another thin film transistor provided by an embodiment of the invention.

According to an embodiment of the invention, there is provided a thin film transistor, as shown in FIG. 2A or 2B, comprising a transparent substrate 30, a gate electrode 31, a gate insulating layer 32, a semiconductor active layer 33, an etch stop layer 34, a source electrode 35a and a drain electrode 35b. By conducting a patterning process on the etch stop layer, the etch stop layer 34 covers the semiconductor active layer 33, and a first via hole 36a and a second via hole 36b are formed in the etch stop layer 34. The source electrode 35a of the thin film transistor contacts with the semiconductor active layer 33 through the first via hole 36a, and the drain electrode 35b of the thin film transistor contacts with the semiconductor active layer 33 through the second via hole 36b.

As can be seen from FIG. 2A or 2B, the gate insulating layer 32 is interposed between the gate electrode 31 and the semiconductor active layer 33.

Further, the semiconductor active layer may be an oxide semiconductor active layer.

Still further, the following two schemes are provided for the pattern of the etch stop layer 34.

Regarding the first scheme, as shown in FIG. 2A, the pattern of the semiconductor active layer 33 and a peripheral edge pattern of the etch stop layer 34 on the thin film transistor are consistent with each other. This makes it possible that the semiconductor active layer 33 and the etch stop layer 34 which has not been formed to have the via holes 36a and 36b are formed by using one patterning process, whereby the process can be simplified.

Regarding the second scheme, as shown in FIG. 2B, on the thin film transistor, the etch stop layer 34 covers the entire transparent substrate with the formed semiconductor active layer 33. As such, after the semiconductor active layer 33 is formed by etching, a layer of etch stop thin film is formed, and the etch stop thin film functions as the etch stop layer 34 which has not been formed to have the via holes 36a and 36b. Namely, prior to formation of the via holes 36a and 36b, it is unnecessary to conduct a patterning process on the etch stop thin film, and the process can also be simplified.

As can be known from the above two schemes, the etch stop layer in the thin film transistor according to embodiments of the invention at least fully cover an upper surface of the semiconductor active layer except for its part that corresponds to the first via hole 36a and the second via hole 36b, and thus, the semiconductor active layer can be effectively protected. Namely, if it is seen in a plan view, a peripheral boundary of the pattern of the etch stop layer is at least consistent with a peripheral boundary of the pattern of the semiconductor active layer or outside the peripheral boundary of the pattern of the semiconductor active layer.

Regarding the thin film transistor provided by embodiments of the invention, as the etch stop layer can effectively protect the semiconductor active layer, the semiconductor active layer is avoided from being broken by illumination and etching. Thus, properties of TFT devices are improved, yield of the whole substrate is increased, and production cost is reduced.

A TFT array substrate according to embodiments of the invention may comprise a transparent substrate and the thin film transistor formed on the transparent substrate according to any of the above embodiments. Therefore, descriptions of the structure of the thin film transistor made as above are also suitable for the TFT array substrate here, and descriptions of repetitive parts will be omitted. In addition, the TFT array substrate may further comprise other constituents thereon, and detailed explanations will be given below with reference to specific examples.

Figure 3A:
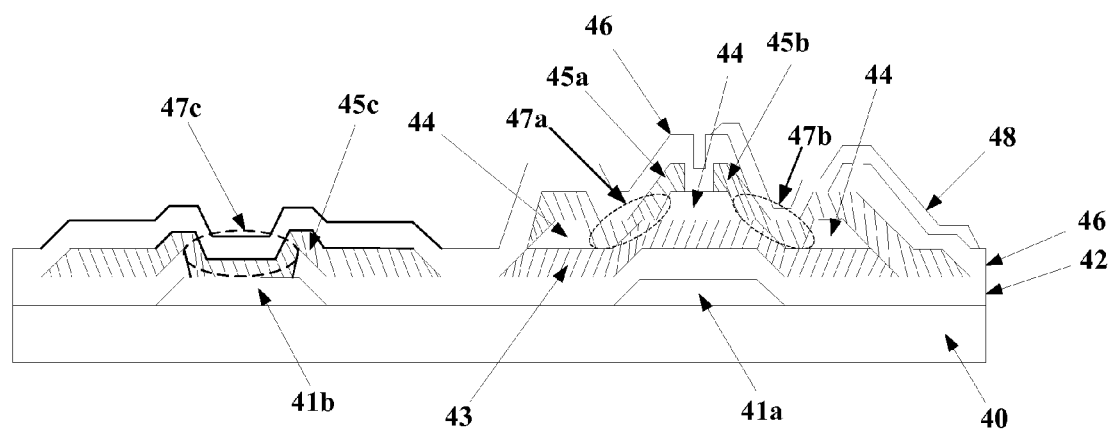
FIG. 3A is a structurally schematic view illustrating a TFT array substrate provided by an embodiment of the invention.
Figure 3B:
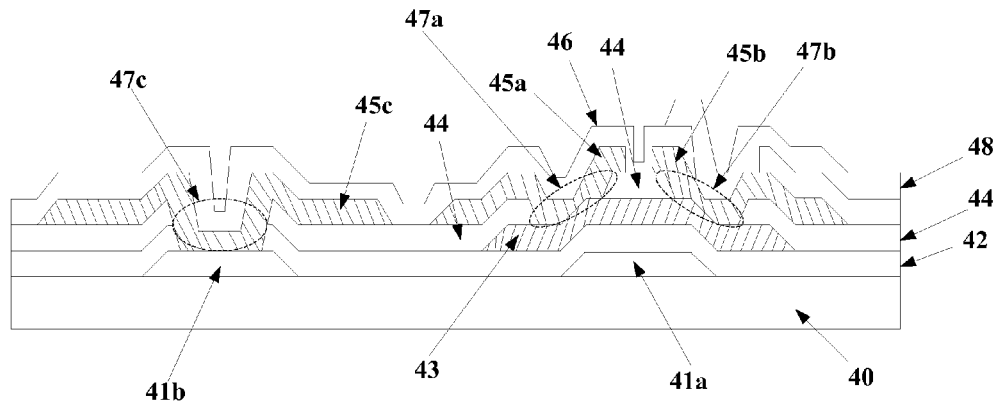
FIG. 3B is a structurally schematic view illustrating another TFT array substrate provided by an embodiment of the invention.

According to an embodiment of the invention, there is provided a TFT array substrate, as shown in FIG. 3A or 3B, comprising: a transparent substrate 40, a gate metal layer 41a, a gate insulating layer 42, an oxide semiconductor active layer 43, an etch stop layer 44, a data-line metal layer, a passivation layer 46 and a pixel electrode layer 48. The gate metal layer is subjected to a patterning process so as to form a gate electrode 41a, a gate line and a gate line lead wire 41b, and the data-line metal layer is subjected to a patterning process so as to form a data line, and a source electrode 45a and a drain electrode 45b of a thin film transistor. The etch stop layer 44 is formed on the oxide semiconductor active layer 43.

The gate electrode 41a, the gate line and the gate line lead wire 41b included in the above gate metal layer are located on the same layer, and the data line, and the source electrode 45a and the drain electrode 45b of the thin film transistor included in the above data-line metal layer are located on the same layer. "Located on the same layer" here means that these constituents are formed by patterning of the same deposited metal layer.

By means of performing a patterning process on the etch stop layer 44, the etch stop layer 44 covers the oxide semiconductor active layer 43, and a first via hole 47a and a second via hole 47b are formed on the etch stop layer 44. The source electrode 45a of the thin film transistor contacts with the oxide semiconductor active layer 43 through the first via hole 47a, and the drain electrode 45b of the thin film transistor contacts with the oxide semiconductor active layer 43 through the second via hole 47b.

In one example, the gate line lead wire 41b contacts with the data-line metal layer through a third via hole 47c by jumping across a layer.

Further, the data-line metal layer further comprises: an assistant gate line lead wire 45c located above the gate line lead wire; and the assistant gate line lead wire 45c is connected to the gate line lead wire 41b through the third via hole 47c so as to form a double-layered gate line lead wire. The assistant gate line lead wire 45c is located in a gate line lead wire region, and is disconnected from a data line, source/drain electrodes and other structures in a display region.

The third via hole and the assistant gate line lead wire 45c are located in a peripheral wiring region of the TFT array substrate, and this can reduce contact resistance and turned-on resistance of the gate line lead wire of the array substrate, decrease voltage drop, and reduce power consumption for driving.

The forgoing is merely one way to implement the layer-crossing contact of the gate line lead wire with the data-line metal layer through the third via hole. In addition to this, it may also be possible that connection of the data-line metal layer to the gate metal layer is implemented through a layer-crossing contact of the data-line metal layer. The case is such as a connecting way between a drain electrode of a switching thin film transistor (switching TFT) in an AMOLED pixel region and a gate electrode of a driving thin film transistor (driving TFT).

Still further, the following two schemes are provided for the pattern of the etch stop layer 44.

Regarding the first scheme, as shown in FIG. 3A, the pattern of the semiconductor active layer 43 and a peripheral edge pattern of the etch stop layer 44 on the TFT array substrate are consistent with each other. This makes it possible that the semiconductor active layer 43 and the etch stop layer 44 which has not been formed to have the via holes 47a and 47b are formed by using one patterning process, whereby the process can be simplified.

Regarding the second scheme, as shown in FIG. 3B, on the TFT array substrate, the etch stop layer 44 covers the entire transparent substrate with the oxide semiconductor active layer 43 formed thereon. As such, after the oxide semiconductor active layer 43 is formed by etching, a layer of etch stop thin film is formed, and the etch stop thin film functions as the etch stop layer 44 which has not been formed to have the via holes 47a and 47b. Namely, prior to formation of the via holes 47a and 47b, it is unnecessary to conduct a patterning process on the etch stop thin film, and the process also can be simplified.

Regarding the TFT array substrate provided by embodiments of the invention, as the etch stop layer can effectively protect the oxide semiconductor active layer, the oxide semiconductor active layer is avoided from being broken by illumination and etching, and in turn, properties of TFT devices are improved. Thus, it is possible that yield of the whole substrate is increased, and production cost is reduced.

In view of differences in the order and the etching process for forming the oxide semiconductor active layer and the etch stop layer in the above TFT array substrates, two methods of manufacturing the TFT array substrates are provided according to embodiments of the invention.

Method 1 is a method of manufacturing the TFT array substrate as shown in FIG. 3A, and will be described with reference to FIG. 4A to FIG. 4L. For example, the method comprises:

S501, forming a gate metal layer on a transparent substrate.

Figure 4A:
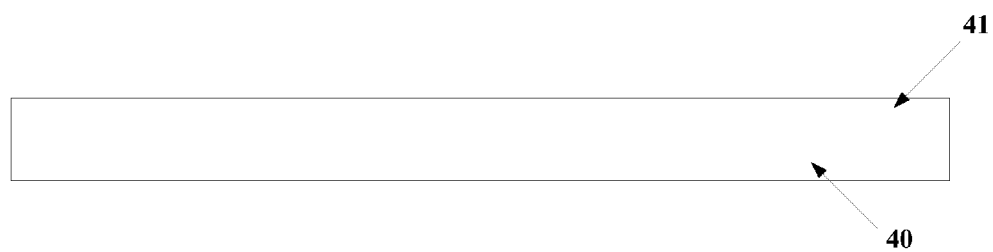
FIG. 4A is a first schematic view illustrating manufacture of a TFT array substrate provided by an embodiment of the invention.

As shown in FIG. 4A, during manufacture of TFTs, a gate metal layer may be fabricated by means of magnetron sputtering. The electrode material can be selected according to different device structures and process requirements, and metals commonly used for gate lines are Mo, Mo—Al—Mo alloy, Mo/Al—Nd/Mo stack material, Cu and metal titanium and an alloy thereof, etc.

S502, performing a patterning process on the gate metal layer, so as to form a gate metal layer.

Figure 4B:
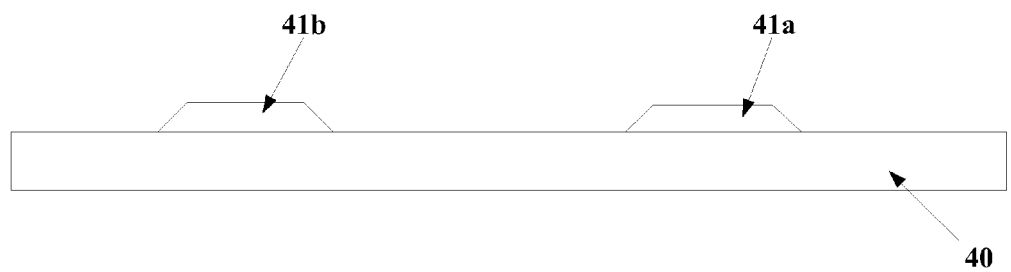
FIG. 4B is a second schematic view illustrating manufacture of the TFT array substrate provided by the embodiment of the invention.

As shown in FIG. 4B, after the gate metal layer is subjected to a patterning process by means of wet etching, a gate metal layer is formed. The gate metal layer comprises a gate electrode 41a, a gate line and a gate line lead wire 41b.

S503, forming a gate insulating layer on the gate metal layer.

Figure 4C:
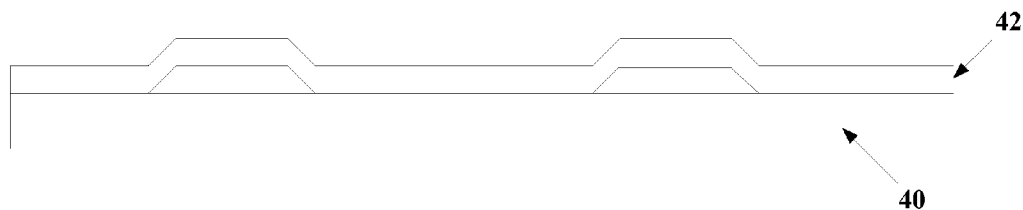
FIG. 4C is a third schematic view illustrating manufacture of the TFT array substrate provided by the embodiment of the invention.

As shown in FIG. 4C, the substrate is cleaned by a process of cleaning prior to film formation (Pre-clean). Then, by means of Plasma Enhanced Chemical Vapor Deposition (PECVD), a gate insulating layer 42 is fabricated on the substrate with the gate metal layer. The material for manufacture of the gate insulating layer is such as, a silicon dioxide ($SiO_2$) thin film, a silicon nitride (SiNx) thin film, a silicon oxynitride (SiOxNy) thin film, an aluminum oxide ($Al_2O_3$) thin film, a TiOx thin film and a composite multilayered film of the above film layers.

S504, performing a surface treatment on the gate insulating layer.

During manufacture of a TFT, characteristics of a surface of the gate insulating layer 42 play a very important role in characteristics of the entire TFT, especially for an oxide thin film transistor. A common treating method is that, a plasma is used for treatment or a surface modification is conducted.

S505, depositing a semiconductor thin film on the transparent substrate with the gate insulating layer formed thereon.

Figure 4D:
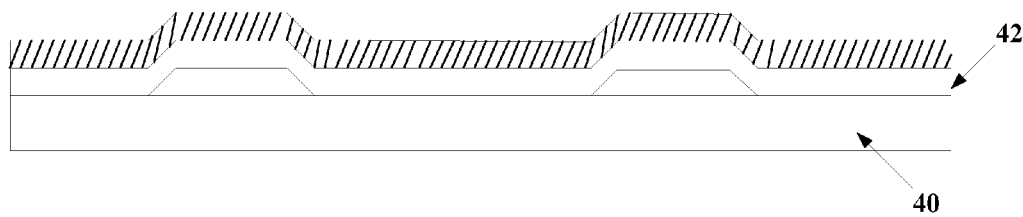
FIG. 4D is a fourth schematic view illustrating manufacture of the TFT array substrate provided by the embodiment of the invention.

As shown in FIG. 4D, a semiconductor thin film is formed on the transparent substrate 40 with the gate insulating layer 42 formed therein. A most key link in manufacture of thin film transistors is production of an oxide semiconductor active layer. Main manufacturing methods are magnetron sputtering deposition, solution method, etc. The oxide semiconductor may be Indium Gallium Zinc Oxide (IGZO), Indium Gallium Tin Oxide (IGTO), Indium Zinc Oxide (IZO) or the like, or composites which are constituted by several different oxide materials at different ratios.

S506, forming an etch stop layer thin film.

Figure 4E:
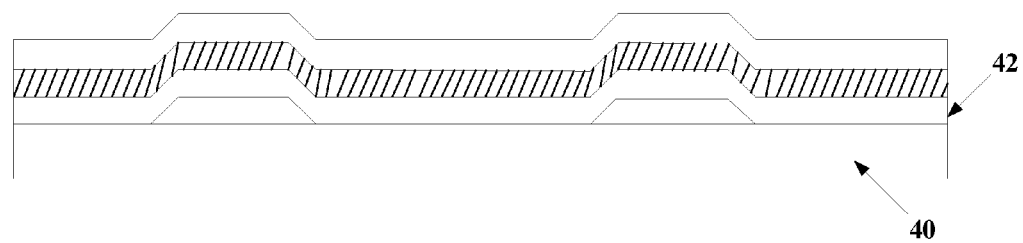
FIG. 4E is a fifth schematic view illustrating manufacture of the TFT array substrate provided by the embodiment of the invention.
Figure 4F:
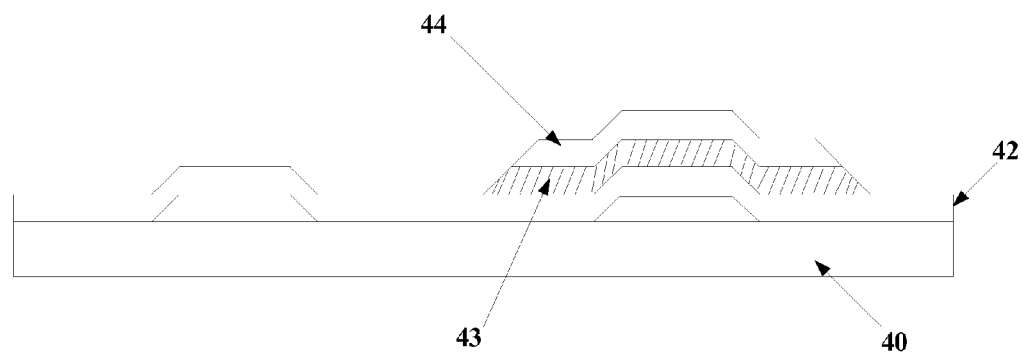
FIG. 4F is a sixth schematic view illustrating manufacture of the TFT array substrate provided by the embodiment of the invention.

As shown in FIG. 4E, an etch stop layer thin film is formed on the semiconductor thin film. An inorganic insulating material such as SiOx, SiNx, SiOxNy, $Al_2O_3$, TiOx or the like may be adopted as material for the etch stop layer thin film, and its purpose is to decrease the harm to the semiconductor thin film during patterning of a data-line metal layer and subsequent film layers.

S507, performing a patterning process on the semiconductor thin film and the etch stop layer thin film.

After the semiconductor thin film and the etch stop thin film are formed sequentially, the two layers are patterned through a Single-step Continuous Etch Method (SCEM). Firstly, the etch stop thin film is subjected to a patterning process with a mask suitable for patterning of an oxide semiconductor active layer, and generally, the etch stop thin film is patterned using a dry etching process or a wet etching process, so as to form an etch stop layer 44 without a via hole in FIG. 4F. After etching of the etch stop thin film, the semiconductor active thin film is patterned, so as to form the oxide semiconductor active layer 43 shown in FIG. 4F. The above patterning process is one patterning process, namely, one mask is used and exposure is conducted once. It should be noted that, the mask used in the SCEM process is the same as a mask used for forming the oxide semiconductor active layer. As such, the pattern obtained by etching of a peripheral edge of the etch stop layer with the mask is consistent with the pattern of the oxide semiconductor active layer.

To sum up, this step is: the semiconductor thin film and the etch stop thin film are formed on the transparent substrate with the gate insulating layer formed thereon, and the oxide semiconductor active layer and the etch stop layer whose patterns are consistent with each other are formed through one patterning process. Thus, the formed etch stop layer after end of this step at least covers an overall upper surface of the semiconductor active layer.

S508, patterning the etch stop layer using a via-hole connection process.

Figure 4G:
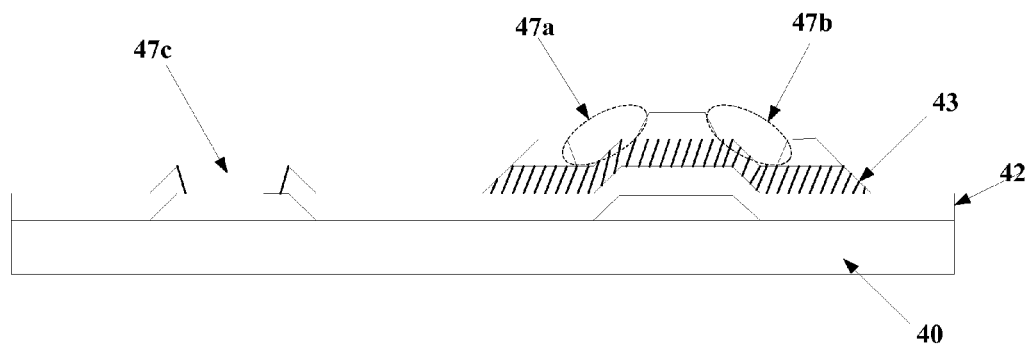
FIG. 4G is a seventh schematic view illustrating manufacture of the TFT array substrate provided by the embodiment of the invention.

After the above step S407 is performed on the oxide semiconductor active layer 43 and the etch stop layer 44 by SCEM, the etch stop layer is patterned by a via-hole connection process, as shown in FIG. 4G, so as to form a first via hole 47a, a second via hole 47b and a third via hole 47c, and the third via hole 47c is located in a peripheral wiring region of the TFT array substrate.

In addition, as the pattern of the etch stop layer has been formed after the patterning treatment of the etch stop layer, length and width of a TFT channel region which is formed after completion of a subsequent process are determined by it.

S509, forming a data-line metal layer.

Figure 4H:
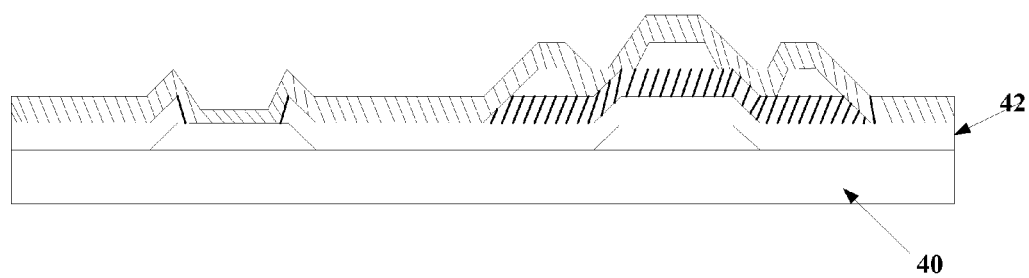
FIG. 4H is a eighth schematic view illustrating manufacture of the TFT array substrate provided by the embodiment of the invention.
Figure 4I:
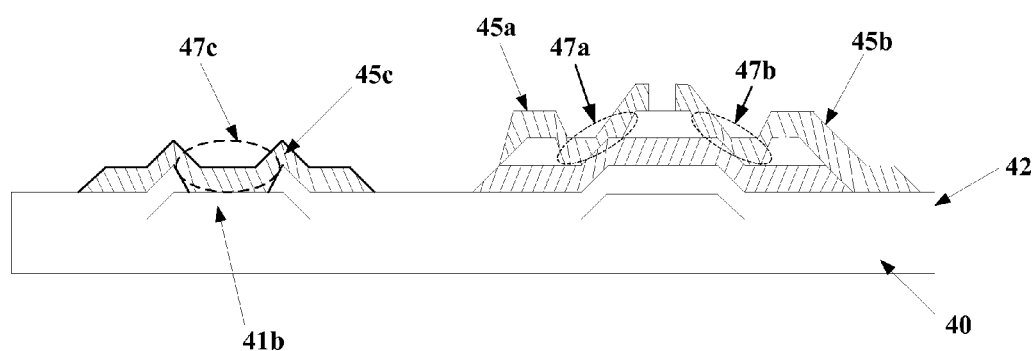
FIG. 4I is a ninth schematic view illustrating manufacture of the TFT array substrate provided by the embodiment of the invention.

As shown in FIG. 4H, firstly, a layer of data-line metal thin film is deposited, and generally, the data-line metal layer is formed by using a magnetron sputtering method. The material for forming the data-line metal thin film can be selected according to different device structures and process requirements, and commonly used metals are Mo, Mo—Al—Mo alloy, Mo/Al—Nd/Mo stack material, Cu and metal titanium and an alloy thereof, ITO electrode, Ti/Al/Ti stack material, Mo/ITO stack material, etc. Thickness of the thin film is such as 100 nm to 350 nm, and its sheet resistance is made to be kept at a relatively low level. After formation of the data-line metal layer, it is subjected to a patterning process. It is patterned by means of etching, for example, a wet etching method is used to pattern it, so as to form a data line, an assistant gate line lead wire (denoted by 45c in FIG. 4I), a source electrode (e.g. 45a in FIG. 4I) and a drain electrode (e.g. 45b in FIG. 4I). The assistant gate line lead wire 45c directly contacts with the gate line lead wire 41b through the third via hole 47c so as to form a double-layered gate line lead wire, and the assistant gate line lead wire 45c is located in a peripheral wiring region of the TFT array substrate. The source electrode 45a contacts with the oxide semiconductor active layer 43 through the first via hole 47a; and the drain electrode 45b contacts with the oxide semiconductor active layer 43 through the second via hole 47b.

S510, forming a passivation layer and etching of a via hole.

Figure 4J:
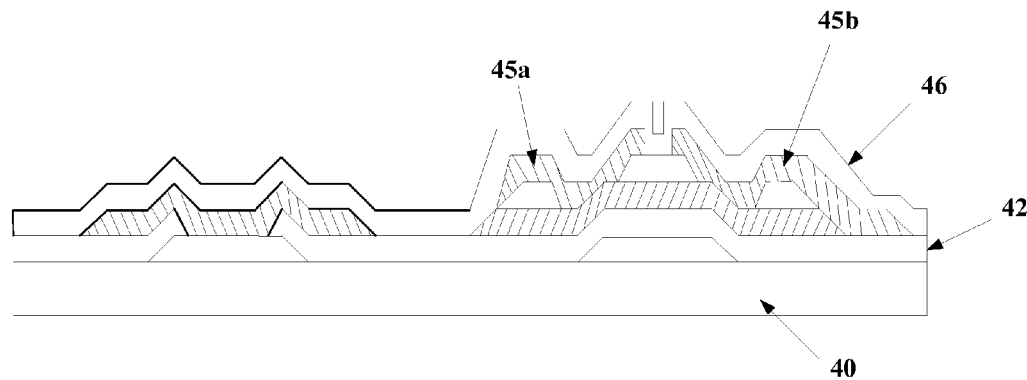
FIG. 4J is a tenth schematic view illustrating manufacture of the TFT array substrate provided by the embodiment of the invention.
Figure 4K:
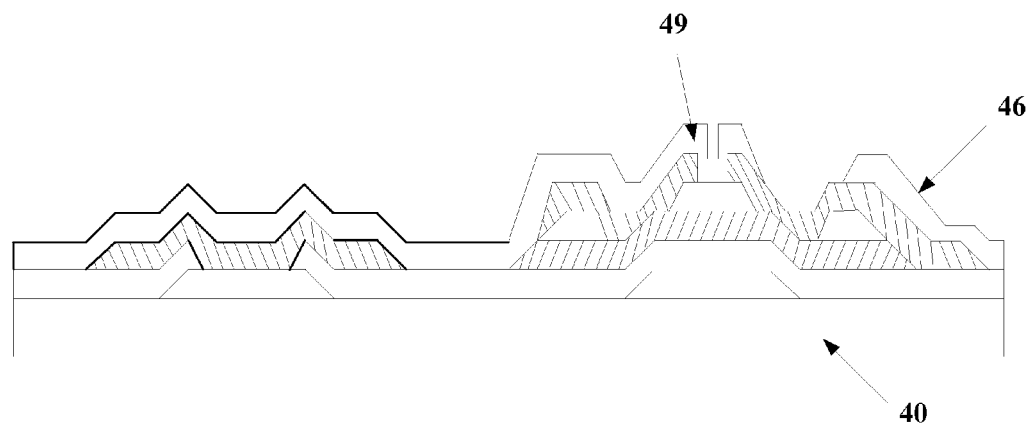
FIG. 4K is a eleventh schematic view illustrating manufacture of the TFT array substrate provided by the embodiment of the invention.

As shown in FIG. 4J, after patterning of the source electrode 45a and the drain electrode 45b, a passivation layer 46 is formed on the entire surface. Generally, an inorganic insulating material such as SiOx, SiNx, SiOxNy, $Al_2O_3$, TiOx or the like needs to be used, and an organic insulating layer with, such as a resin material and an acrylic system material may also be used. An etching process for a via hole is conducted after formation of the passivation layer 46, and the formed via hole is denoted by 49 in FIG. 4K and is used to make a pixel electrode which is formed later contact with the drain electrode.

S511, depositing and patterning of a pixel electrode layer.

Figure 4L:
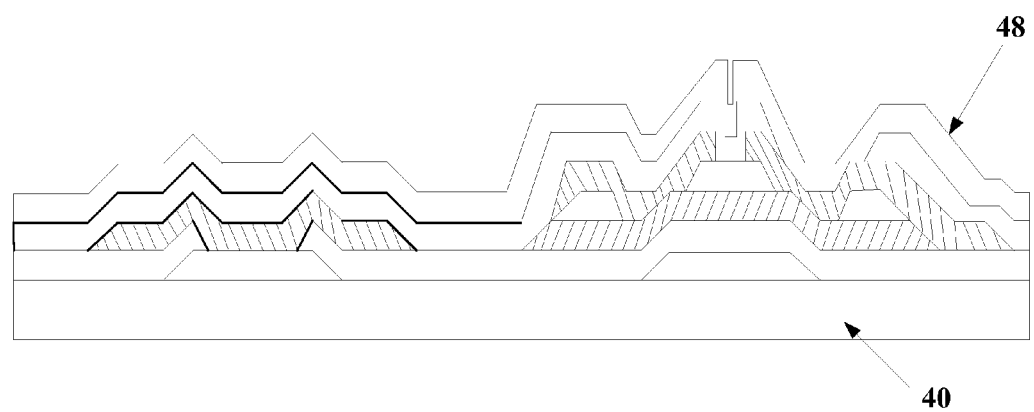
FIG. 4L is a twelfth schematic view illustrating manufacture of the TFT array substrate provided by the embodiment of the invention.

As shown in FIG. 4L, after formation of the via hole, a pixel electrode layer 48 is formed, and subjected to a patterning process by means of wet etching. For example, indium tin oxide may be used as material for the pixel electrode. The TFT array substrate as shown in FIG. 3A is finally formed.

As such, without adding a procedure, the etch stop layer is etched by using the via-hole connection process, so that except for a part of the oxide semiconductor active layer which contacts with the first via hole and the second via hole, other parts thereof each are covered by the etch stop layer, and the oxide semiconductor active layer is avoided from being broken by illumination and etching. Thus, it is possible that properties of TFT devices are improved, yield of the whole substrate is increased, and production cost is reduced.

Method 2 is a method of manufacturing the TFT array substrate shown in FIG. 3B, and will be described with reference to FIG. 5A to FIG. 5C. In the embodiment of the invention, except that the producing order and the etching order (steps S706-S708 here) of an etch stop layer are different from the producing order and the etching order (steps S506-S508) of the etch stop layer in the above embodiments, other steps may refer to the above embodiments.

Steps of the method comprises:

S701, forming a gate metal layer on a transparent substrate.

S702, performing a patterning process on the gate metal layer, so as to form a gate metal layer.

S703, forming a gate insulating layer on the gate metal layer.

S704, performing a surface treatment on the gate insulating layer.

S705, forming a semiconductor thin film on the transparent substrate with the gate insulating layer formed thereon.

S706, forming an oxide semiconductor active layer through a patterning process.

Figure 5A:
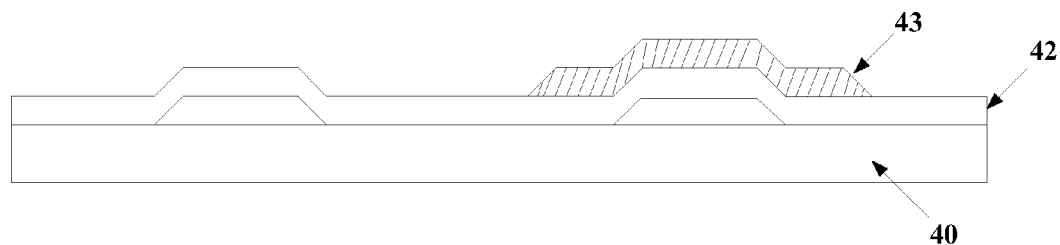
FIG. 5A a first schematic view illustrating manufacture of a TFT array substrate provided by another embodiment of the invention.

As shown in FIG. 5A, a patterning process is conducted on the semiconductor active thin film mainly through wet etching or dry etching, so as to form an oxide semiconductor active layer 43. It should be noted that, different etching methods can be selected in view of different process requirements.

S707, forming an etch stop layer thin film.

Figure 5B:
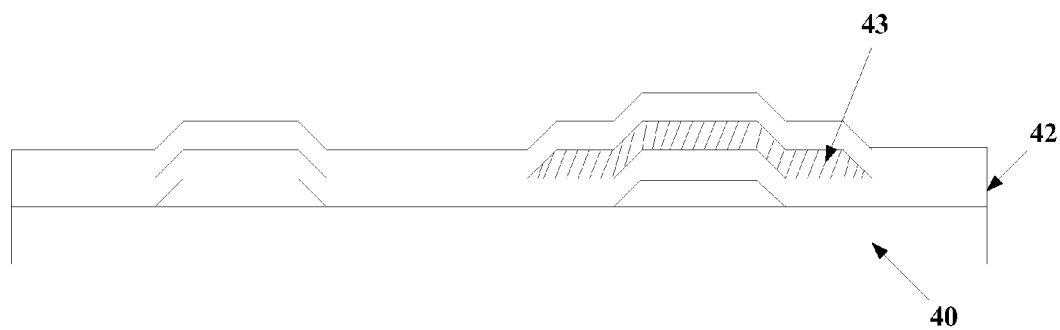
FIG. 5B is a second schematic view illustrating manufacture of the TFT array substrate provided by the another embodiment of the invention.

As shown in FIG. 5B, an etch stop layer thin film is directly formed on the oxide semiconductor active layer 43. Material for the etch stop layer thin film is such as SiOx, SiNx, SiOxNy, $Al_2O_3$, TiOx or other inorganic insulating material, and its purpose is to decrease the harm to the semiconductor thin film during patterning of a data-line metal layer.

Wherein, the etch stop thin film covers the entire transparent substrate with the oxide semiconductor active layer formed thereon. Therefore, the formed etch stop layer after end of this step at least covers an overall upper surface of the semiconductor active layer.

S708, patterning the etch stop thin film using a via-hole connection process.

Figure 5C:
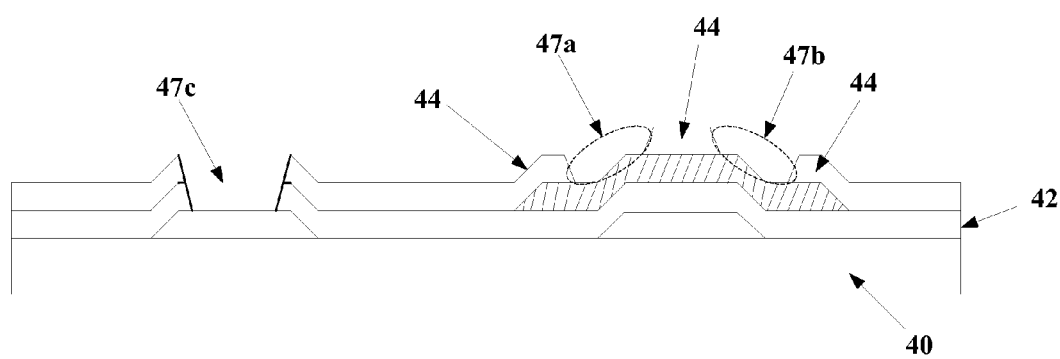
FIG. 5C is a third schematic view illustrating manufacture of the TFT array substrate provided by the another embodiment of the invention.

After completion of the fabrication process of the etch stop thin film in the above S707, the etch stop thin film is patterned by using a via-hole connection process, as shown in FIG. 5C. An etch stop layer 44 is formed.

It should be noted that, a mask used to etch the etch stop layer in the via-hole connection process is different from masks for etch stop layers which are referred to in the course of previous processes. The mask for the etch stop layer in the embodiment of the invention is a via-hole manufacturing process, and with the mask, a region of the etch stop layer and a region of the gate insulating layer (namely, a region denoted by 47c in FIG. 5C) in which a data line lead wire contacts a gate line lead wire, and a region of the etch stop layer (namely, regions denoted by 47a and 47b in FIG. 5C) in which source and drain electrodes contact the oxide semiconductor active layer are etched off, and other regions of the etch stop layer are remained.

In addition, as the pattern of the etch stop layer has been formed after the patterning treatment of the etch stop layer, length and width of a TFT channel region which is formed after completion of a subsequent process are determined by it.

S709, forming a data-line metal layer.

S710, forming a passivation layer and a via-hole process.

S711, forming and patterning a pixel electrode layer.

The TFT array substrate shown in FIG. 3B is finally formed.

As such, without adding a procedure, the etch stop layer is etched by using the via-hole connection process, so that except for a part of the oxide semiconductor active layer which contacts with the first via hole and the second via hole, other parts thereof are each covered by the etch stop layer, and the oxide semiconductor active layer is avoided from being broken by illumination and etching. Thus, it is possible that properties of TFT devices are improved, yield of the whole substrate is increased, and production cost is reduced.

According to an embodiment of the invention, there is further provided a display device, containing any of the above-mentioned TFT array substrates. The display device may be a liquid crystal display, an OLED display, an active electronic paper display and other display device using the above array substrate.

Some specific embodiments according to the invention have been described above, but it does not mean that the present invention is limited thereto. For example, the descriptions are made above by using the transparent substrate as an example. However, an opaque substrate may also be used as the substrate for manufacturing a thin film transistor array.

Based on the forgoing descriptions, embodiments of the invention can at least provide the following structures and methods:

(1). A thin film transistor, comprising: a gate electrode, a gate insulating layer, a semiconductor active layer, an etch stop layer, a source electrode and a drain electrode, wherein, the gate insulating layer is interposed between the gate electrode and the semiconductor active layer, the etch stop layer covers the semiconductor active layer, and has a first via hole and a second via hole formed therein which expose a part of the semiconductor active layer, the source electrode of the thin film transistor contacts with the semiconductor active layer through the first via hole, and the drain electrode of the thin film transistor contacts with the semiconductor active layer through the second via hole.

(2). The thin film transistor according to (1), wherein, the etch stop layer at least fully covers an upper surface of the semiconductor active layer except for its parts which correspond to the first via hole and the second via hole.

(3). The thin film transistor according to (1) or (2), wherein, material for the semiconductor active layer is an oxide material.

(4). The thin film transistor according to any of (1)-(3), wherein, a peripheral edge pattern of the etch stop layer and the pattern of the semiconductor active layer are consistent with each other.

(5). A thin film transistor array substrate, comprising: a substrate and a thin film transistor formed on the substrate, wherein the thin film transistor comprises a gate electrode, a gate insulating layer, a semiconductor active layer, an etch stop layer, a source electrode and a drain electrode, wherein, the gate insulating layer is interposed between the gate electrode and the semiconductor active layer, the etch stop layer covers the semiconductor active layer, and has a first via hole and a second via hole formed therein which expose a part of the semiconductor active layer, the source electrode of the thin film transistor contacts with the semiconductor active layer through the first via hole, and the drain electrode of the thin film transistor contacts with the semiconductor active layer through the second via hole.

(6). The thin film transistor array substrate according to (5), wherein, the etch stop layer at least fully covers an upper surface of the semiconductor active layer except for its parts which correspond to the first via hole and the second via hole.

(7). The thin film transistor array substrate according to (5) or (6), further comprising: a gate line, a gate line lead wire, a data line and a data lead wire, wherein the gate line and the gate line lead wire are located on the same layer as the gate electrode; and the data line and the data lead wire are located on the same layer as the source electrode and the drain electrode.

(8). The thin film transistor array substrate according to (7), further comprising an assistant gate line lead wire which is located on the same layer as the data line and above the gate line lead wire, wherein the gate line lead wire contacts with the assistant gate line lead wire through a third via hole.

(9). The thin film transistor array substrate according to any of (5)-(8), wherein, a peripheral edge pattern of the etch stop layer and the pattern of the semiconductor active layer are consistent with each other; or the etch stop layer covers the entire substrate with the semiconductor active layer formed thereon.

(10). The thin film transistor array substrate according to any of (5)-(9), wherein, the material for the semiconductor active layer is an oxide material.

(11). The thin film transistor array substrate according to any of (5)-(10), further comprising a pixel electrode which is connected to the drain electrode.

(12). A method of manufacturing a thin film transistor array substrate, comprising:

forming a gate metal layer, a gate insulating layer, a semiconductor active layer and an etch stop layer on a substrate in sequence, the gate metal layer comprising a gate electrode, a gate line and a gate line lead wire, and the etch stop layer at least covering an overall upper surface of the semiconductor active layer;

forming a first via hole and a second via hole in the etch stop layer using a via-hole connection process so as to expose a part of the semiconductor active layer; and forming a data-line metal layer, a passivation layer and a pixel electrode layer in sequence, the data-line meta layer comprising a data line, a data line lead wire and a source electrode and a drain electrode of a thin film transistor, the source electrode contacting with the semiconductor active layer though the first via hole, and the drain electrode contacting with the semiconductor active layer through the second via hole.

(13). The method according to (12), wherein, the data-line metal layer further comprises an assistant gate line lead wire located above the gate line lead wire, and wherein prior to formation of the data-line metal layer, the method further comprises: forming a third via hole exposing the gate line lead wire, so that the assistant gate line lead wire in the data-line metal layer is connected to the gate line lead wire through the third via hole and thus a double-layered gate line lead wire is formed.

(14). The method according to (12) or (13), wherein, forming the semiconductor active layer and the etch stop layer comprises:

depositing a semiconductor thin film and an etch stop thin film on the substrate with the gate insulating layer formed thereon, and forming the semiconductor active layer and the etch stop layer whose patterns are consistent with each other through one patterning process.

(15). The method according to (12) or (13), wherein, forming the semiconductor active layer and the etch stop layer comprises:

depositing a semiconductor thin film on the substrate with the gate insulating layer formed thereon, and forming the semiconductor active layer through a patterning process;

depositing an etch stop thin film functioning as the etch stop layer on the substrate with the semiconductor active layer formed thereon.

16. A display device, comprising the thin film transistor array substrate according to any of (5)-(11).

In addition, as for the thin film transistor array substrate as stated by the above item (9), when a periphery edge pattern of the etch stop layer and the pattern of the semiconductor active layer are consistent with each other, the assistant gate line lead wire contacts with the gate line lead wire through a third via hole across the gate insulating film and above the gate line lead wire; and when the etch stop layer covers the entire substrate with the semiconductor active layer formed thereon, the assistant gate line lead wire contacts with the gate line lead wire through a third via hole across the gate insulating film and the etch stop layer and above the gate line lead wire.

The foregoing are merely the specific embodiments of the invention, but the protection scope of the invention is not limited thereto. All changes or replacements, as would be obvious to any of those skilled in the technical field within the technical scope of the present invention, shall be embraced within the protection scope of the present invention. Thus, the protection scope of the present invention shall be defined by the protection scope of the following claims.

What is claimed is:

1. A thin film transistor array substrate, comprising: a substrate and a thin film transistor formed on the substrate,
   wherein the thin film transistor comprises a gate electrode, a gate insulating layer, a semiconductor active layer, an etch stop layer, a source electrode and a drain electrode,
   wherein, the gate insulating layer is interposed between the gate electrode and the semiconductor active layer,
   the etch stop layer covers the semiconductor active layer, and has a first via hole and a second via hole formed therein which expose a part of the semiconductor active layer,
   the source electrode of the thin film transistor contacts with the semiconductor active layer through the first via hole, and the drain electrode of the thin film transistor contacts with the semiconductor active layer through the second via hole,
   wherein, a peripheral edge pattern of the etch stop layer and the pattern of the semiconductor active layer are consistent with each other,
   wherein, the peripheral edge of the etch stop layer is aligned with a peripheral edge of the semiconductor active layer,
   wherein, the etch stop layer does not extend beyond the pattern of the semiconductor active layer,
   wherein the thin film transistor array substrate further comprises a gate line, a gate line lead wire, a data line and a data lead wire, the gate line and the gate line lead wire are located on the same layer as the gate electrode; and the data line and the data lead wire are located on the same layer as the source electrode and the drain electrode,
   wherein the thin film transistor array substrate further comprises an assistant gate line lead wire which is located on the same layer as the data line and above the gate line lead wire, the gate line lead wire contacts with the assistant gate line lead wire through a third via hole, and
   wherein the thin film transistor array substrate comprises a display region and a peripheral wiring region, the thin film transistor, the gate line and the data line are disposed in the display region, the gate line lead wire, the assistant gate line lead wire and the third hole are disposed in the peripheral wiring region.

2. The thin film transistor array substrate claimed as claim 1, wherein, the etch stop layer at least fully covers an upper surface of the semiconductor active layer except for its parts which correspond to the first via hole and the second via hole.

3. The thin film transistor array substrate claimed as claim 1, wherein, the material for the semiconductor active layer is an oxide material.

4. The thin film transistor array substrate claimed as claim 1, further comprising a pixel electrode which is connected to the drain electrode.

5. A display device, comprising the thin film transistor array substrate claimed as claim 1.

6. A method of manufacturing a thin film transistor array substrate, comprising:
   forming a gate metal layer, a gate insulating layer, a semiconductor active layer and an etch stop layer on a substrate in sequence, the gate metal layer comprising a gate electrode, a gate line and a gate line lead wire, and the etch stop layer at least covering an overall upper surface of the semiconductor active layer;
   forming a first via hole and a second via hole on the etch stop layer using a via-hole connection process so as to expose a part of the semiconductor active layer; and
   forming a data-line metal layer, a passivation layer and a pixel electrode layer in sequence, the data-line meta layer comprising a data line, a data line lead wire and a source electrode and a drain electrode of a thin film transistor, the source electrode contacting with the semiconductor active layer though the first via hole, and the drain electrode contacting with the semiconductor active layer through the second via hole,
   wherein, forming the semiconductor active layer and the etch stop layer comprises:
   depositing a semiconductor thin film and an etch stop thin film on the substrate with the gate insulating layer formed thereon, and forming the semiconductor active layer and the etch stop layer whose patterns are consistent with each other through one patterning process,
   wherein, the peripheral edge of the etch stop layer is aligned with a peripheral edge of the semiconductor active layer,
   wherein, the etch stop layer does not extend beyond the pattern of the semiconductor active layer,
   wherein, the data-line metal layer further comprises an assistant gate line lead wire located above the gate line lead wire,
   wherein prior to formation of the data-line metal layer, the method further comprises: forming a third via hole exposing the gate line lead wire, so that the assistant gate line lead wire in the data-line metal layer is connected to the gate line lead wire through the third via hole and thus a double-layered gate line lead wire is formed, and
   wherein the thin film transistor array substrate comprises a display region and a peripheral wiring region, the thin film transistor, the gate line and the data line are disposed in the display region, the gate line lead wire, the assistant gate line lead wire and the third hole are disposed in the peripheral wiring region.

* * * * *